(12) United States Patent
Takeuchi et al.

(10) Patent No.: US 8,754,572 B2
(45) Date of Patent: Jun. 17, 2014

(54) ACTUATOR

(75) Inventors: Hiromitsu Takeuchi, Kiyosu (JP); Takashi Maeno, Kiyosu (JP); Naoto Kuriyama, Kiyosu (JP); Takanori Nakai, Kiyosu (JP); Yutaka Tsuchikawa, Kiyosu (JP); Yoji Kimura, Kiyosu (JP)

(73) Assignee: Toyoda Gosei Co., Ltd., Aichi-pref. (JP)

( * ) Notice: Subject to any disclaimer, the term of this patent is extended or adjusted under 35 U.S.C. 154(b) by 443 days.

(21) Appl. No.: 13/221,972

(22) Filed: Aug. 31, 2011

(65) Prior Publication Data

US 2012/0074817 A1    Mar. 29, 2012

(30) Foreign Application Priority Data

Sep. 24, 2010  (JP) .................................. 2010-213515

(51) Int. Cl.
*H01L 41/08* (2006.01)
(52) U.S. Cl.
USPC .......................................... 310/328; 310/800
(58) Field of Classification Search
USPC .................................................. 310/800, 328
See application file for complete search history.

(56) References Cited

U.S. PATENT DOCUMENTS

| | | | |
|---|---|---|---|
| 6,847,155 B2 * | 1/2005 | Schwartz et al. | 310/328 |
| 7,038,357 B2 | 5/2006 | Goldenberg et al. | |
| 7,362,032 B2 * | 4/2008 | Pelrine et al. | 310/309 |
| 7,834,527 B2 * | 11/2010 | Alvarez Icaza Rivera et al. | 310/344 |
| 8,446,065 B2 * | 5/2013 | Browne et al. | 310/311 |
| 8,458,889 B2 * | 6/2013 | Tsuchikawa et al. | 29/595 |
| 2007/0200468 A1 * | 8/2007 | Heim | 310/800 |
| 2012/0049876 A1 * | 3/2012 | Matsumura et al. | 324/754.2 |
| 2012/0060355 A1 * | 3/2012 | Tsuchikawa et al. | 29/592.1 |

FOREIGN PATENT DOCUMENTS

| | | |
|---|---|---|
| DE | 10 2006 025 177 A1 | 12/2007 |
| JP | 2009-124875 A | 6/2009 |

OTHER PUBLICATIONS

Office Action dated Dec. 4, 2012 issued from the Japanese Patent Office for the JP counterpart application No. 2010-213515.

* cited by examiner

*Primary Examiner* — Derek Rosenau

(74) *Attorney, Agent, or Firm* — Posz Law Group, PLC

(57) ABSTRACT

An actuator includes a sheet having dielectric elastomer layers and conductive rubber layers provided on the front and back faces of each dielectric elastomer layer. The sheet is wrapped and rolled about a coil spring. The actuator expands the rolled sheet along an expansion direction of the coil spring by applying a voltage to the conductive rubber layers on the front and back faces of the dielectric elastomer layer, and contracts the rolled sheet along a contraction direction of the coil spring by stopping the application of the voltage. The actuator further includes a fiber layer located between the coil spring and the rolled sheet wrapped about the coil spring.

5 Claims, 3 Drawing Sheets

ACTUATOR

BACKGROUND OF THE INVENTION

The present invention relates to an actuator.

Conventionally, a type of actuator has been known that includes dielectric rubber layers (dielectric elastomer layers) and conductive rubber layers provided on the front and back faces of each dielectric rubber layer. This type of actuator is operated by executing and stopping voltage application to the conductive rubber layers so that the dielectric elastomer layers are expanded or contracted.

Such actuators are used for artificial muscles. More specific examples include an actuator disclosed in Japanese Laid-Open Patent Publication No. 2009-124875. The actuator is formed by wrapping a sheet having dielectric elastomer layers and conductive rubber layers about a coil spring, so that the sheet is rolled. Voltage application to the conductive rubber layers on the front and back faces of each dielectric elastomer layers of the sheet is executed or stopped, so that the rolled sheet is expanded or contracted along the direction of expansion and contraction of the coil spring.

The coil spring in the actuator urges the actuator along the axial direction of the rolled sheet. The actuator is urged along the axial direction thereof to minimize expansion of the actuator in directions perpendicular to the axial direction when the actuator operates to expand along the axial direction. Accordingly, the displacement (operational amount) of the actuator in the axial direction is maximized as much as possible.

SUMMARY OF THE INVENTION

In the above actuator, the sheet, which is made of a high adherability material such as rubber, is wrapped and rolled about the coil spring. The sheet therefore tends to adhere to the helical metal wire of the coil spring. When the rolled sheet expands as the actuator operates, the coil spring expands accordingly, so that the intervals between sections of the helical wires of the coil spring are increased. At this time, parts of the sheet that are in the vicinity of parts that adhered to the metal wire are expanded, and the dielectric elastomer layers become thin in parts in the vicinity of the expanded parts. When the dielectric elastomer layer becomes thin, the insulation between the conductive rubber layers on the front and back faces of the thinned parts can become degraded, which can result in malfunction of the actuator.

Accordingly, it is an objective of the present invention to provide an actuator that prevents dielectric elastomer layers of a sheet wrapped and rolled about a coil spring from becoming thin, thereby preventing the insulating capability or property of the dielectric elastomer layers from deteriorating.

To achieve the foregoing objective, the present invention provides an actuator including a sheet having a dielectric elastomer layer and conductive rubber layers provided on the front and back faces of the dielectric elastomer layer. The sheet is wrapped and rolled about a coil spring. The actuator expands the rolled sheet along an expansion direction of the coil spring by applying a voltage to the conductive rubber layers on the front and back faces of the dielectric elastomer layer, and contracts the rolled sheet along a contraction direction of the coil spring by stopping the application of the voltage. A fiber layer is located between the coil spring and the rolled sheet wrapped about the coil spring.

According to the above configuration, the fiber layer formed between the coil spring and the sheet, which is wrapped to be rolled about the coil spring, prevents the sheet from being adhered to the helical metal wire of the coil spring. The fiber layer is unlikely to be adhered to the sheet and the metal wire because fibers forming the fiber layer create a great number of recesses and protrusions at parts contacting the sheet and the metal wire of the coil spring. Therefore, when the rolled sheet expands as the actuator operates, the helical metal wire of the coil spring and the fiber layer are allowed to move relative to each other, and the fiber layer and the sheet are allowed to move relative to each other. The fiber layer in the actuator prevents parts of the sheet in the vicinity of parts that are adhered to the metal wire of the coil spring from being expanded. The parts of the dielectric elastomer layers are prevented from becoming thin unlike the prior art. The insulating property of the dielectric elastomer layer is therefore maintained.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

One embodiment of the present invention will now be described with reference to the drawings.

Figure 1A:
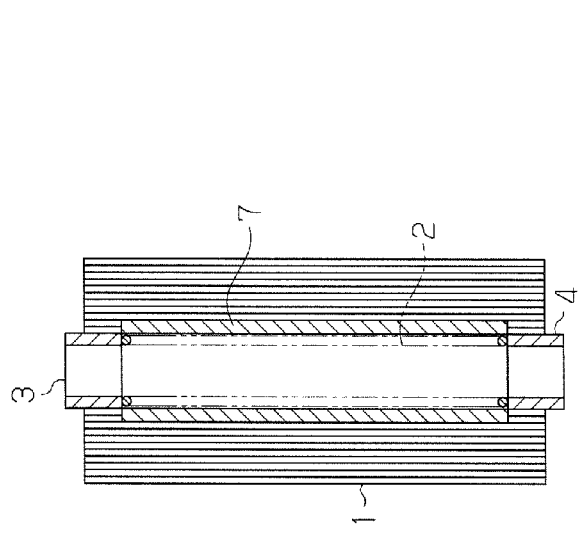
FIGS. 1A to 1C conceptually show a normal state of an actuator, an expanded state of the actuator, and the structure of a sheet of the actuator.
Figure 1B:
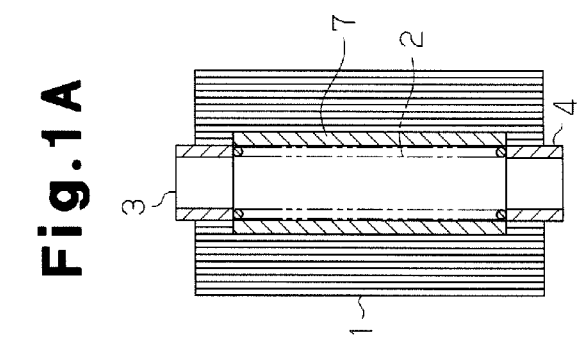

An actuator shown in FIG. 1A is formed by rolling a sheet 1 so that it becomes cylindrical. The cylindrical sheet 1 is expanded and contracted along the axial direction thereof, so that the length along the axial direction is changed. FIG. 1A shows a normal state of the actuator, or a contracted state, and FIG. 1B shows an expanded state of the actuator from the normal state.

As shown in FIG. 1A, a coil spring 2 is located in the cylindrical sheet 1 in a compressed state. Also, pipes 3, 4 are fixed to the inner circumferential surface of both ends in the axial direction of the cylindrical sheet 1. The pipes 3, 4 maintain the coil spring 2 inside the sheet 1 in a compressed state. Therefore, the elastic force of the coil spring 2 urges the pipes 3, 4 away from each other. Thus, the actuator is urged to extend in the axial direction (vertical direction as viewed in FIG. 1A) by the elastic force of the coil spring 2. In the actuator, a fiber layer 7 formed of a great number of fibers is formed between the rolled cylindrical sheet 1 and the compressed coil spring 2. That is, in the actuator, the fiber layer 7 is formed about the compressed coil spring 2, and the sheet 1 is wrapped about the outer circumferential surface of the fiber layer 7.

Figure 1C:
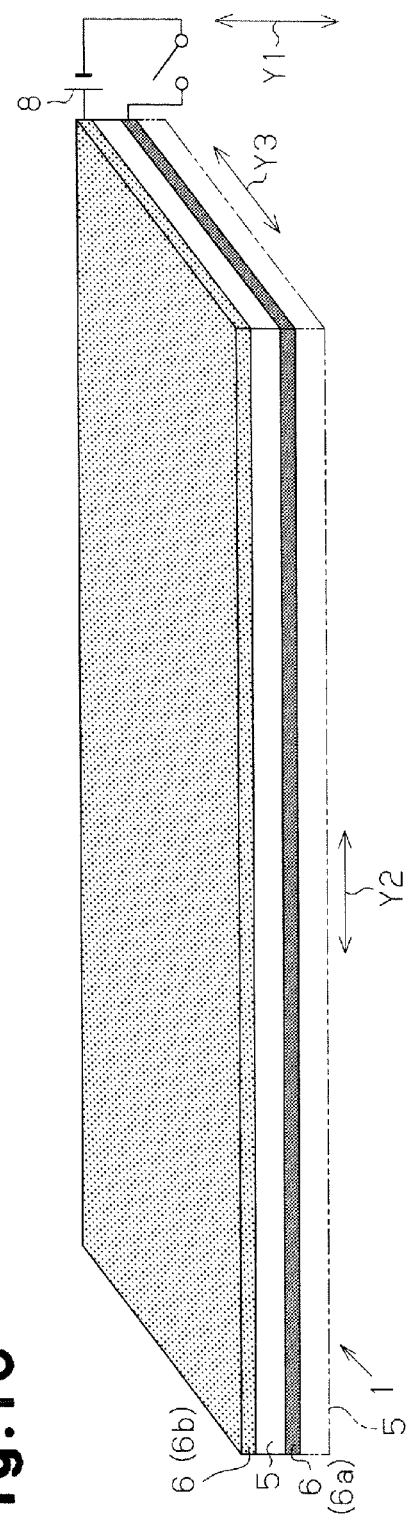

FIG. 1C conceptually shows a state in which the cylindrical sheet 1 is developed. The sheet 1 is formed by alternately stacking a plurality of dielectric rubber layers (dielectric elastomer layers) 5 and a plurality of conductive rubber layers 6 (6a, 6b) along the direction of thickness (direction of arrow Y1). In other words, the conductive rubber layers 6 (6a, 6b) are provided on both the front and back faces of the dielectric elastomer layer 5 of the sheet 1.

In the sheet 1, the conductive rubber layers 6 are made of general-purpose rubber, and the dielectric elastomer layers 5 are made of a high polymer (such as a high polymer gel), such as polyrotaxane, in which more specifically, cross-linking points are movable. The conductive rubber layers 6a,6b sandwich each dielectric elastomer layer 5. The conductive rubber layer 6a is connected to a negative terminal of a power source 8, and the conductive rubber layer 6b is connected to a positive terminal of the power source 8. When voltage is applied to the conductive rubber layers 6a, 6b, the dielectric elastomer layers 5 are contracted in the thickness direction (direction of arrow Y1), while expanding in a direction perpendicular to the thickness direction (direction of arrow Y2 and direction of arrow Y3). When the application of voltage to the conductive rubber layer 6a, 6b is stopped, the dielectric elastomer layers 5 are restored, by the elasticity thereof, from the contraction along the thickness direction and the expansion along the directions perpendicular to the thickness direction.

The rolled cylindrical sheet 1 shown in FIGS. 1A and 1B is contracted and expanded along the axial direction of the cylindrical sheet 1 by executing or stopping application of voltage to the conductive rubber layers 6a, 6b (FIG. 1C), so that the sheet 1 is contracted and expanded. That is, when voltage is applied to the conductive rubber layers 6a, 6b, the cylindrical sheet 1 extends along the axial direction as shown in FIG. 1B. When voltage application to the conductive rubber layers 6a, 6b is stopped, the cylindrical sheet 1 is contracted along the axial direction from the expanded state shown in FIG. 1B to a contracted state shown in FIG. 1A. Such expansion and contraction of the cylindrical sheet 1 operates the actuator, so that the actuator is displaced along the axial direction.

Figure 2:
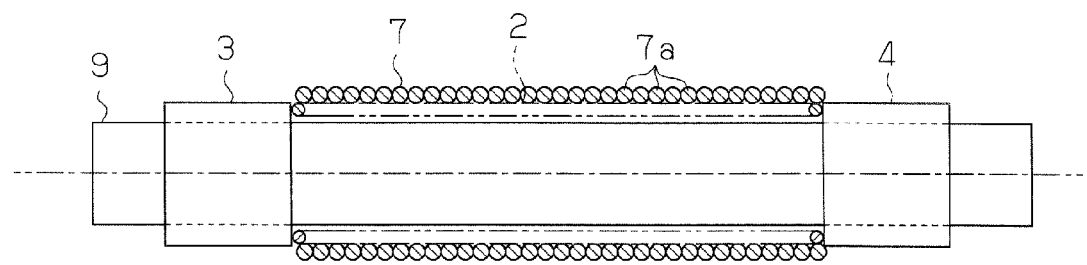
FIG. 2 is a side view showing a core about which a sheet is wrapped to be rolled.
Figure 3:
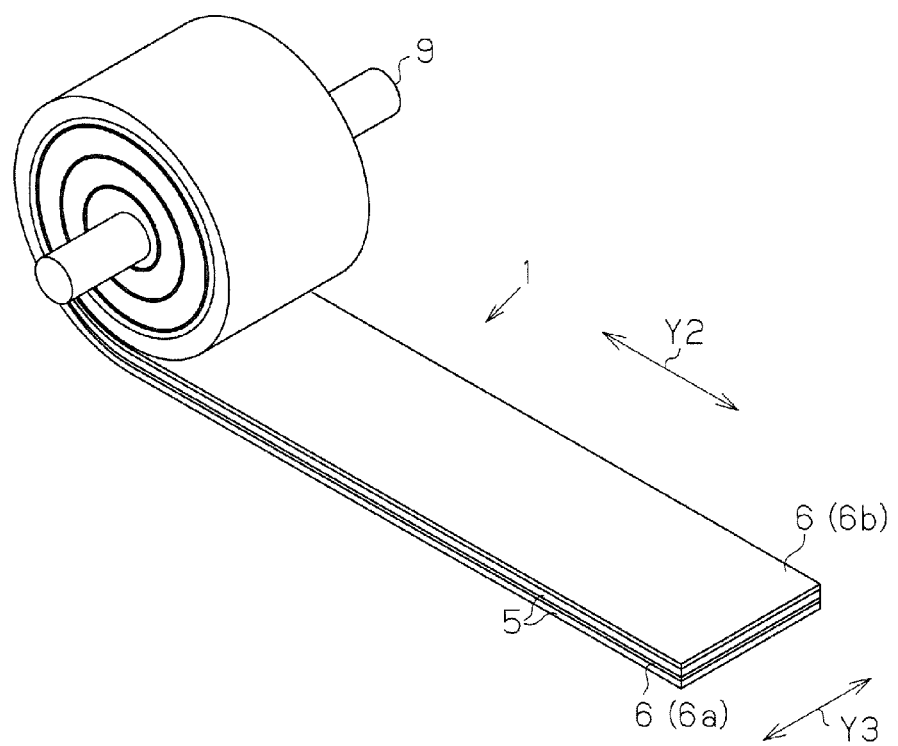
FIG. 3 is a perspective view showing a state in which the sheet is being wrapped about the core.

With reference to FIGS. 2 and 3, a procedure for forming the fiber layer 7 between the cylindrical sheet 1 and the coil spring 2 inside the sheet 1 in the actuator will be described.

FIG. 2 is a side view showing a core 9 that is used for rolling the sheet 1 so that it becomes cylindrical. Before wrapping the sheet 1 to form a roll, the coil spring 2 in a compressed state is attached to the outer circumferential surface of the core 9. Also, the pipes 3, 4 are attached on both ends of the outer circumferential surface of the core 9 along the expansion and contraction direction of the coil spring 2 (left and right direction as viewed in FIG. 2). Accordingly, the core 9 is in a state of extending through the coil spring 2 and the pipes 3, 4, which are arranged on the outer circumferential surface. Further, the fiber layer 7 is formed over the entire circumferential direction of the compressed coil spring 2 (along the circumferential direction of the core 9). The fiber layer 7 can be formed, for example, by helically winding a thread 7a made of a great number of fibers (cotton fibers) about the coil spring 2.

Thereafter, the coil spring 2 and the pipes 3, 4 are attached. Also, the sheet 1 is wrapped about the core 9, about which the fiber layer 7 has been formed, while rotating the core 9. This forms a rolled sheet 1 about the core 9 (specifically, about the pipes 3, 4 and the fiber layer 7) as shown in FIG. 3. After the sheet 1 is rolled about the core 9 in this manner, the core 9 is removed from the rolled sheet 1. At this time, the coil spring 2, the pipes 3, 4, and the fiber layer 7, which are shown in FIG. 3, remain inside the rolled sheet 1. In this manner, the fiber layer 7 is formed between the cylindrical sheet 1 of the actuator and the coil spring 2 provided inside the sheet 1 as shown in FIGS. 1A and 1B.

Figure 4:
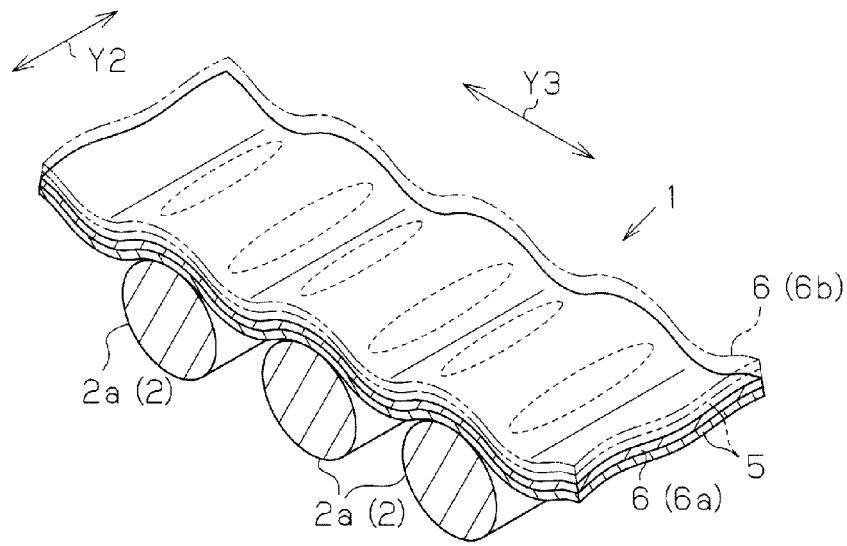
FIG. 4 is an enlarged view showing the relationship between a sheet and a coil spring in an actuator having no fiber layer.
Figure 5:
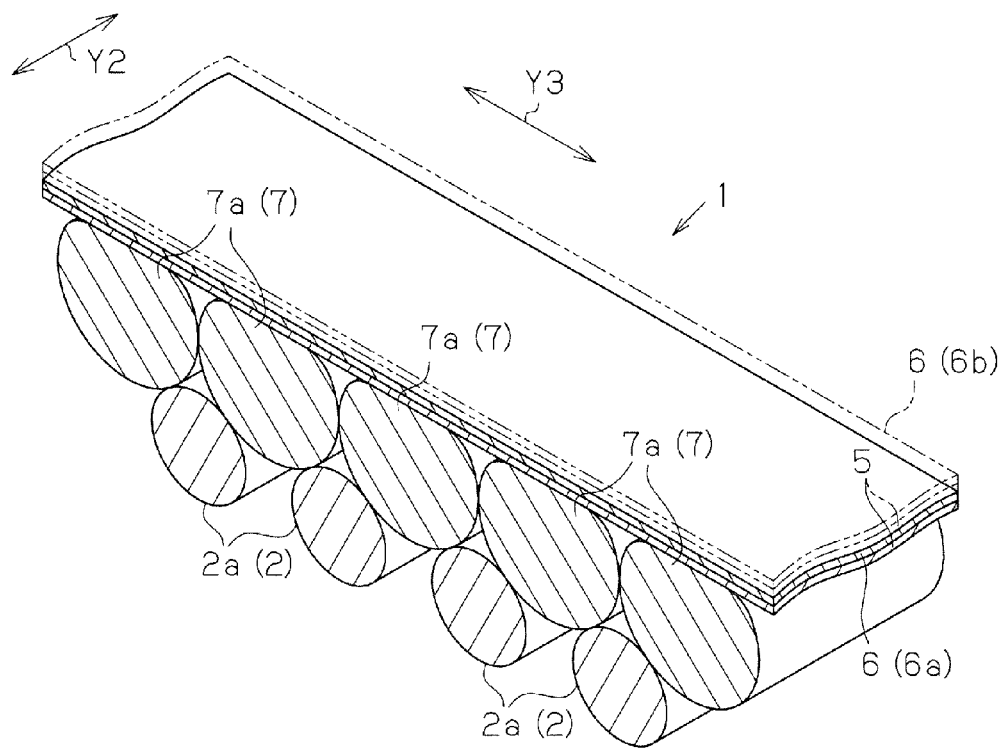
FIG. 5 is an enlarged view showing the relationship between a sheet, a fiber layer, and a coil spring in an actuator having a fiber layer.

With reference to FIGS. 4 and 5, advantages of the fiber layer 7 formed between the cylindrical sheet 1 and the coil spring 2 inside the sheet 1 in the actuator will be described.

In a case where the fiber layer 7 is not formed, when the sheet 1 is wrapped about the coil spring 2 in a rolled state, the metal wire 2a of the coil spring 2 directly contacts the sheet 1 as shown in FIG. 4. Since the sheet 1 is formed of a high adherability material such as rubber, the sheet 1 can be adhered to the helical metal wire 2a of the coil spring 2 when directly contacting the metal wire 2a. If the actuator operates in such a state so that the rolled sheet 1 extends along the direction of arrow Y3, the coil spring 2 extends accordingly so that the intervals between sections of the helical metal wire 2a of the coil spring 2 are increased. At this time, parts of the sheet 1 that are in the vicinity of the parts adhered to the metal wire 2a (parts that are encompassed by broken lines in FIG. 4) are expanded, and the dielectric elastomer layers 5 become thin in the expanded parts. When the dielectric elastomer layer 5 becomes thin, the insulation between the conductive rubber layers 6 (6a, 6b) on the front and back faces of the thinned parts can become degraded, which can result in malfunction of the actuator.

In contrast, in a case where the fiber layer 7 is formed, the fiber layer 7 formed of the thread 7a is located between the sheet 1 and the metal wire 2a of the coil spring 2 in the actuator as shown in FIG. 5. The outer diameter of the thread 7a forming the fiber layer 7 is set to be greater than the interval between sections of the metal wire 2a when the coil spring 2 is expanded.

The fiber layer 7 interposed between the sheet 1 and the metal wire 2a of the coil spring 2 does not allow the sheet 1 to directly contact the metal wire 2a. Accordingly, the sheet 1 is prevented from being adhered to the metal wire 2a. Having recesses and projections formed by a great number of fibers forming the fiber layer 7 (the thread 7a) at the parts contacting the sheet 1 and the metal wire 2a, the fiber layer 7 is unlikely to be adhered to the sheet 1 or the metal wire 2a. Therefore, when the rolled sheet 1 is expanded in the direction of arrow Y3 as the actuator operates, the metal wire 2a and the fiber layer 7 are allowed to move relative to each other in the direction of arrow Y3. Also, the fiber layer 7 and the sheet 1 are allowed to be displaced along the direction of arrow Y3. Further, the fiber layer 7 has elasticity so that it is displaced as the sheet 1 is expanded or contracted when the rolled sheet 1 is expanded or contracted during the operation of the actuator. The fiber layer 7 in the actuator prevents parts (parts encompassed by the broken lines in FIG. 4) of the sheet 1 in the vicinity of parts that are adhered to the metal wire 2a from being expanded. Accordingly, the dielectric elastomer layer 5 is prevented from becoming thin in such parts. The insulating property of the dielectric elastomer layer 5 is therefore maintained.

The above described present embodiment has the following advantages.

(1) Since the fiber layer 7 made of a great number of fibers is interposed between the sheet 1 wrapped about the coil spring 2 and the coil spring 2, the sheet 1 is not likely to be adhered to the metal wire 2a of the coil spring 2. Therefore, when the sheet 1 is expanded along the direction of arrow Y3 in FIG. 5 as the actuator operates, parts (parts encompassed by the broken lines in FIG. 4) of the sheet 1 in the vicinity of parts that are adhered to the metal wire 2a are not expanded. Further, it is possible to prevent the dielectric elastomer layer 5 from becoming thin through such expansion, and the insulating performance of the dielectric elastomer layer 5 is prevented from being degraded.

(2) In the sheet 1 wrapped in a rolled state about the coil spring 2, parts that correspond to the intervals between sections of the helical metal wire 2a of the coil spring 2 act to enter the intervals as shown in FIG. 4 when the sheet 1 is being wrapped. As a result, the parts of the sheet 1 that correspond to the intervals between sections of the helical metal wire 2a of the coil spring 2 draw the parts of the sheet 1 that are adhered to the metal wire 2a into the intervals between the sections of the wire 2a. This can also be a cause of expansion of the sheet 1 that results in thinning of the dielectric elastomer layer 5. However, according to the present embodiment, the fiber layer 7 as shown in FIG. 5 is located between the sheet 1 and the coil spring 2. Thus, when the sheet 1 is wrapped about the core 9, the accompanying pressure deforms the fiber layer 7 due to its flexibility (elasticity) in correspondence with the shapes of the intervals between the sections of the wire 2a. Accordingly, the parts of the sheet 1 that correspond to the intervals between sections of the metal wire 2a of the coil spring 2 are prevented from entering the intervals between the sections of the metal wire 2a when the sheet 1 is wrapped. This also prevents the sheet 1 from being expanded as described above.

(3) Since the fiber layer 7 has elasticity so that it can be displaced when the rolled sheet 1 is expanded or contracted, the fiber layer 7 is expanded as the rolled sheet 1 is expanded when the sheet 1 is expanded through operation of the actuator. Therefore, the fiber layer 7 does not act against expansion and contraction of the sheet 1.

(4) The outer diameter of the thread 7a forming the fiber layer 7 is greater than the interval between sections of the metal wire 2a when the coil spring 2 is expanded. Therefore, even when the rolled sheet 1 is expanded through the operation of the actuator and the intervals between the sections of the helical metal wire 2a of the coil spring 2 are increased by the expansion of the coil spring 2 due to expansion of the sheet 1, the thread 7a does not enter the intervals between sections of the wire 2a.

(5) The fiber layer 7 is formed simply by helically winding the thread 7a made of a great number of fibers about the coil spring 2. Therefore, the fiber layer 7 can be formed easily.

(6) In a compressed state, the flexibility of the coil spring 2 along the radial direction is lowered. Thus, if the sheet 1 is directly wrapped about the coil spring 2 so as to be rolled as shown in FIG. 4, bearing stress applied to the metal wire 2a of the coil spring 2 by the sheet 1 cannot be easily released, and the sheet 1 contacts the metal wire 2a with high bearing stress. As a result, the sheet 1 is likely to be adhered to the metal wire 2a of the coil spring 2. In this case, when the rolled sheet 1 is expanded so that the intervals of the sections of the metal wire 2a of the coil spring 2 are increased, parts (parts encompassed by the broken lines in FIG. 4) of the sheet 1 that are close to parts that are adhered to the metal wire 2a are likely to be expanded. Accordingly, the dielectric elastomer layer 5 tends to become thin in such parts. However, such a problem can be avoided by the present embodiment, in which the fiber layer 7 is provided between the sheet 1 and the coil spring 2.

The above described embodiment may be modified as follows.

The fiber layer 7 may be formed by wrapping unwoven cloth or fabric made of a great number of fibers about the coil spring 2. In this case, the fiber layer 7 can be formed by wrapping unwoven cloth or fabric about the coil spring 2 once. Thus, compared to a case where a thread 7a is helically wound many times, the fiber layer 7 can be formed easily.

The fiber layer 7 may be formed by wrapping a mass of a great number of intertwined fibers (such as cotton) about the coil spring 2. In this case, the fiber layer 7 can be formed by wrapping a mass of a great number of fibers about the coil spring 2. Thus, compared to a case where a thread 7a is helically wound many times, the fiber layer 7 can be formed easily.

The fibers for forming the fiber layers 7 do not need to be natural fibers such as cotton fibers, but may be chemical fibers, such as polyester fibers and acrylic fibers.

Therefore, the present examples and embodiments are to be considered as illustrative and not restrictive and the invention is not to be limited to the details given herein, but may be modified within the scope and equivalence of the appended claims.

The invention claimed is:

1. An actuator comprising a sheet having a dielectric elastomer layer and conductive rubber layers provided on the front and back faces of the dielectric elastomer layer and a coil spring, the sheet being wrapped and rolled about the coil spring, wherein the actuator expands the rolled sheet along an expansion direction of the coil spring by applying a voltage to the conductive rubber layers on the front and back faces of the dielectric elastomer layer, and contracts the rolled sheet along a contraction direction of the coil spring by stopping the application of the voltage,
the actuator further comprising a fiber layer located between the coil spring and the rolled sheet wrapped about the coil spring.

2. The actuator according to claim 1, wherein the fiber layer is formed by winding, about the coil spring, one of a thread, unwoven cloth, cotton, and fabric.

3. The actuator according to claim 1, wherein the fiber layer has elasticity so that the fiber layer is capable of being displaced as the rolled sheet is expanded or contacted.

4. The actuator according to claim 1, wherein
the fiber layer is formed by helically winding a thread about the coil spring, and
the outer diameter of the thread is greater than the interval between sections of the coil spring when the coil spring is expanded.

5. The actuator according to claim 1, wherein the coil spring is retained in a compressed state, and in this state, the fiber layer is formed about the coil spring and the sheet is wrapped about the fiber layer.

* * * * *